(12) United States Patent
Wang et al.

(10) Patent No.: US 8,330,094 B2
(45) Date of Patent: Dec. 11, 2012

(54) OPTICAL SENSING MODULE AND OPTICAL MOUSE WITH THE SAME

(75) Inventors: Wei-Chung Wang, Hsinchu (TW); Kuo-Hsiung Li, Hsinchu (TW)

(73) Assignee: Pixart Imaging Inc., Hsinchu (TW)

( * ) Notice: Subject to any disclaimer, the term of this patent is extended or adjusted under 35 U.S.C. 154(b) by 796 days.

(21) Appl. No.: 12/395,668

(22) Filed: Feb. 28, 2009

(65) Prior Publication Data

US 2010/0181466 A1 Jul. 22, 2010

(30) Foreign Application Priority Data

Jan. 16, 2009 (TW) ................................. 98101711 A

(51) Int. Cl.
*G06M 7/00* (2006.01)
(52) U.S. Cl. ........ 250/221; 250/216; 250/239; 345/163; 345/164
(58) Field of Classification Search .................. 250/216, 250/221, 239; 345/163–164
See application file for complete search history.

(56) References Cited

U.S. PATENT DOCUMENTS

| | | | |
|---|---|---|---|
| 2005/0093825 A1 * | 5/2005 | Chang et al. ................. | 345/166 |
| 2006/0289727 A1 * | 12/2006 | Bricaud et al. ............... | 250/221 |
| 2007/0008285 A1 * | 1/2007 | Chiu et al. ................... | 345/166 |
| 2007/0241263 A1 * | 10/2007 | Lee et al. ..................... | 250/221 |

FOREIGN PATENT DOCUMENTS

| CN | 1719395 A | 1/2006 |
|---|---|---|
| TW | 549490 | 8/2003 |

* cited by examiner

*Primary Examiner* — Georgia Y Epps
*Assistant Examiner* — Kevin Wyatt
(74) *Attorney, Agent, or Firm* — Chun-Ming Shih

(57) ABSTRACT

In an optical mouse, an optical sensing module includes a printed circuit board and a packaging body. The printed circuit board has an upper surface and a lower surface on opposite sides. The packaging body including a compound, an optical sensing die and a lead frame is disposed on the lower surface. The compound has a transparent surface. The optical sensing die used for receiving light is located inner the compound and has an optical sensing surface facing the transparent surface of the compound. The lead frame with a shoulder portion is electrically connected to the optical sensing die. The shoulder portion extends out from the compound along a direction that is parallel to the optical sensing surface of the optical sensing die. The shoulder portion is fixed on the lower surface. The optical sensing module may be used in an optical mouse. In the above optical sensing module, since the packaging body is positioned on the lower surface of the printed circuit board and the shoulder portion is fixed thereon, a preciseness of assembling the above optical sensing module can be easily improved.

18 Claims, 5 Drawing Sheets

OPTICAL SENSING MODULE AND OPTICAL MOUSE WITH THE SAME

BACKGROUND

This application claims priority to a Taiwan application No. 098101711 filed Jan. 16, 2009.

1. Field of the Invention

The invention relates to an optical sensing module and an optical mouse with the same, and more particularly, to an optical sensing module with assembly preciseness easier to be improved and an optical mouse with the same.

2. Description of the Related Art

FIG. 1 is a schematic cross-section view illustrating a conventional optical mouse. Referring to FIG. 1, the optical mouse 100 comprises a shell 11 and an optical sensing module 10 disposed in the shell 11. The optical sensing module 10 comprises a printed circuit board 12, a packaging body 14, a lens unit 15, a printed circuit board rack 16 and a bottom plate 17 connected to the shell 11. The printed circuit board 12 of the optical sensing module 10 has an upper surface 122, a lower surface 124 and a through hole 126. The upper surface 122 and the lower surface 124 are opposite to each other, and the through hole 126 passes through the upper surface 122 and the lower surface 124. The packaging body 14 is disposed above the through hole 126.

The packaging body 14 comprises a compound 140, an optical sensing die 146 and a lead frame 148. The optical sensing die 146 is packaged in the compound 140. The lead frame 148 is electrically connected with the optical sensing die 146 and extends through the side surface 144 of the compound 140 and out thereof. The packaging body 14 is positioned on the upper surface 122 of the printed circuit board 12 by the transparent surface 142 of the compound 140. The portion of lead frame 148 outside the compound 140 is bended toward and inserted through the printed circuit board 12 from the upper surface 122 to the lower surface 124 and welded thereon by the solder 13. The lens unit 15 is disposed under the through hole 126 and fixed on the bottom plate 17. The printed circuit board rack 16 is disposed between the printed circuit board 12 and the bottom plate 17.

As shown in FIG. 1, the light 110 reflected from the object, which, for example, is a mouse pad, contacted to the bottom of the optical mouse 100 into the optical mouse 100 may be focused on the optical sensing die 146, thus the moving locus of the optical mouse 100 would be recorded as a set of continue pictures shotted in high speed. The moving direction and the distance of the optical mouse 100 may be determined by analyzing the changes between the positions of the characteristic points in the pictures. Therefore, the positioning of the cursor may be achieved.

However, in the assembling process of the optical mouse 100, the accuracy of the interval D between the optical sensing die 146 and the lens unit 15 predetermined according to the focal length of the lens unit 15 may be affected by the error resulted from the deformation of the compound 140, the height error of the optical sensing die 146 disposed in the compound 140, the thickness error of the printed circuit board 12 and the height error of the printed circuit board rack 16, thus the light unsuccessfully focus on the optical sensing die 146. Accordingly, the problem of decreasing the assembling error and improving preciseness of assembling for raising the accuracy of focusing light to the optical sensing die 146 is one of the issues attended by those skilled in the related fields.

BRIEF SUMMARY

The invention is directed to an optical sensing module with high assembly preciseness.

The invention is directed to an optical mouse for accurately focusing the light reflected by an external object to the optical sensing die.

The invention provides an optical sensing module comprising a printed circuit board and a packaging body. The printed circuit board has an upper surface and a lower surface opposite to each other. The packaging body disposed on the lower surface of the printed circuit board comprises a compound, an optical sensing die and a lead frame. The compound has a transparent surface, the optical sensing die is disposed in the compound, and an optical sensing surface of the optical sensing die is faced to the transparent surface of the compound for receiving a light. The lead frame electrically connected with the optical sensing die has a shoulder portion extends out from the compound along the direction parallel to the optical sensing surface of the optical sensing die and fixed on the lower surface of the printed circuit board.

The invention further provides an optical mouse comprising a shell and the aforementioned optical sensing module disposed in the shell.

In the optical sensing module and the optical mouse with the same, the packaging body is positioned on the lower surface of the printed circuit board and fixed to each other by the shoulder portion of the lead frame. Thus, during the assembling process of the optical sensing module, the assembling error resulted from the deformation of the compound and the thickness of the printed circuit board may be prevented. Therefore, the preciseness of assembling the optical sensing module may be improved and then the accuracy of the light focusing to the optical sensing die may be raised.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
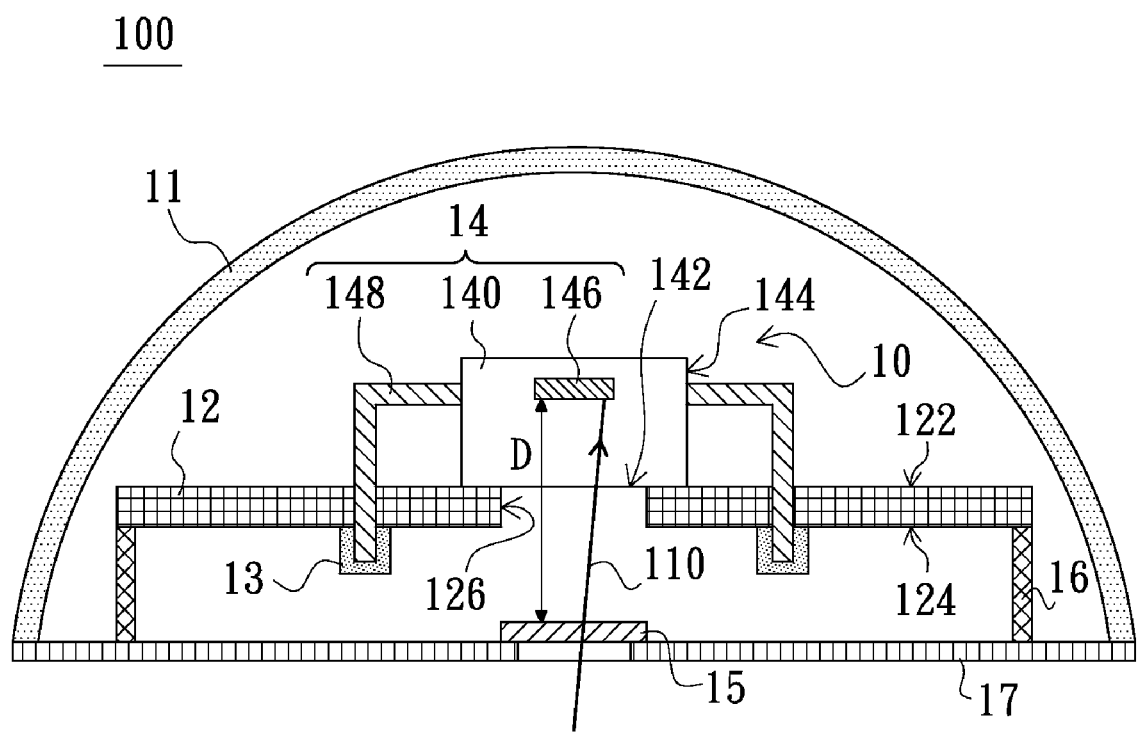
FIG. 1 is a schematic cross-section view illustrating a conventional optical mouse.
Figure 2:
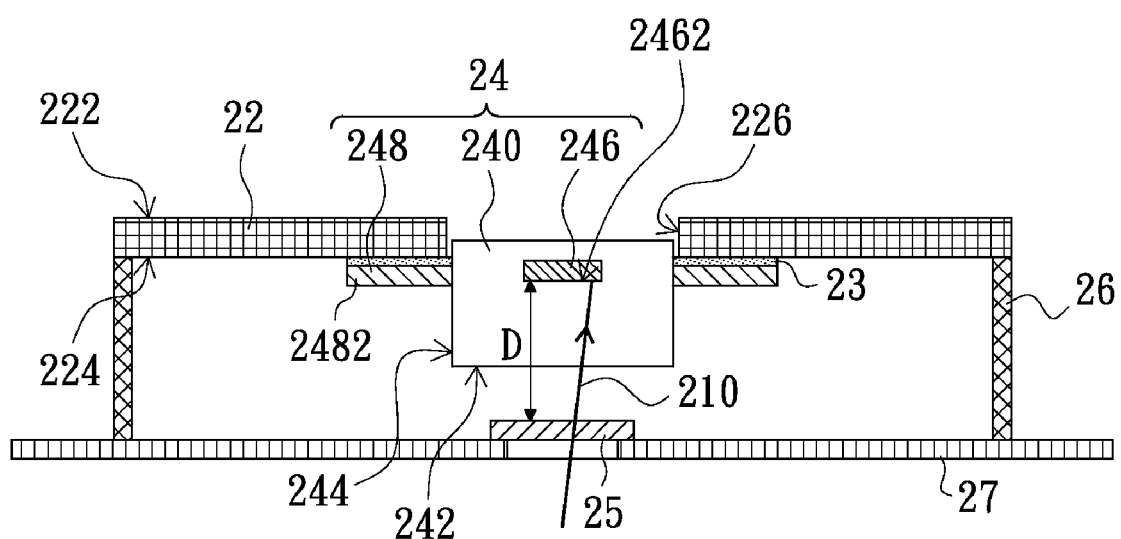
FIG. 2 is a schematic cross-section view illustrating the optical sensing module according to the first embodiment of the invention.

FIG. 2 is a schematic cross-section view illustrating the optical sensing module according to the first embodiment of the invention. Referring to FIG. 2, the optical sensing module 20 comprises a printed circuit board 22 and a packaging body 24. The printed circuit board 22 has an upper surface 222 and a lower surface 224 opposite to each other. The packaging body 24 comprises a compound 240 with a transparent surface 242 and a side surface 244 connected therewith, an optical sensing die 246 and a lead frame 248. The optical sensing die 246 is disposed in the compound 240 and an optical sensing surface 2462 thereof is faced to the transparent surface 242 for receiving a light 210 incident to the optical sensing module 20. For example, the light 210 is reflected from an external object (not shown) outside the optical sensing module 20.

The lead frame 248 with a shoulder portion 2482 is electrically connected to the optical sensing die 246. The shoulder portion 2482 extends out from the side surface 244 of the compound 240 along a direction parallel to the optical sensing surface of the optical sensing die. It should be noted that the packaging body 24 is fixed on the lower surface 224 of the printed circuit board 22 by the shoulder portion 2482.

In this embodiment, the lead frame 248 is welded to fix on the lower surface 224 of the printed circuit board 22 by the solder 23. Furthermore, the printed circuit board 22 also has a containing hole 226 such as a through via passes through the upper surface 222 and the lower surface 224. The packaging body 24 may be embedded into the containing hole 226 partially.

It is worth to say that the optical sensing module 20 may also comprise a lens unit 25, a printed circuit board rack 26 and a bottom plate 27. The lens unit 25 is disposed at the path of the light 210 transmitted to the optical sensing die 246. In detail, the lens unit 25 may dispose on the bottom plate 27 located under the packaging body 24 for focusing the light 210 reflected by the external object to the optical sensing die 246. The printed circuit board rack 26 is disposed between the bottom plate 27 and the printed circuit board 22 for holding the printed circuit board 22.

As the aforementioned, the packaging body 24 is positioned on the lower surface 224 of the printed circuit board 22 and fixed thereon by the shoulder portion 2482 of the lead frame 248. Therefore, the affecting factors of the preciseness of the interval D between the optical sensing die 246 and the lens unit 25 may be decreased. In other words, during the assembling process of the optical sensing module 20, it is not only the thickness error of the printed circuit board 22 affecting the assembly preciseness may be eliminated, the error resulted from the deformation of the compound 240 of the packaging body 24 affecting the assembly preciseness may also be prevented. Therefore, the assembly preciseness of the optical sensing module 20 may be improved and then the accuracy of focusing the light on the optical sensing die 246 may be raised.

Figure 3:
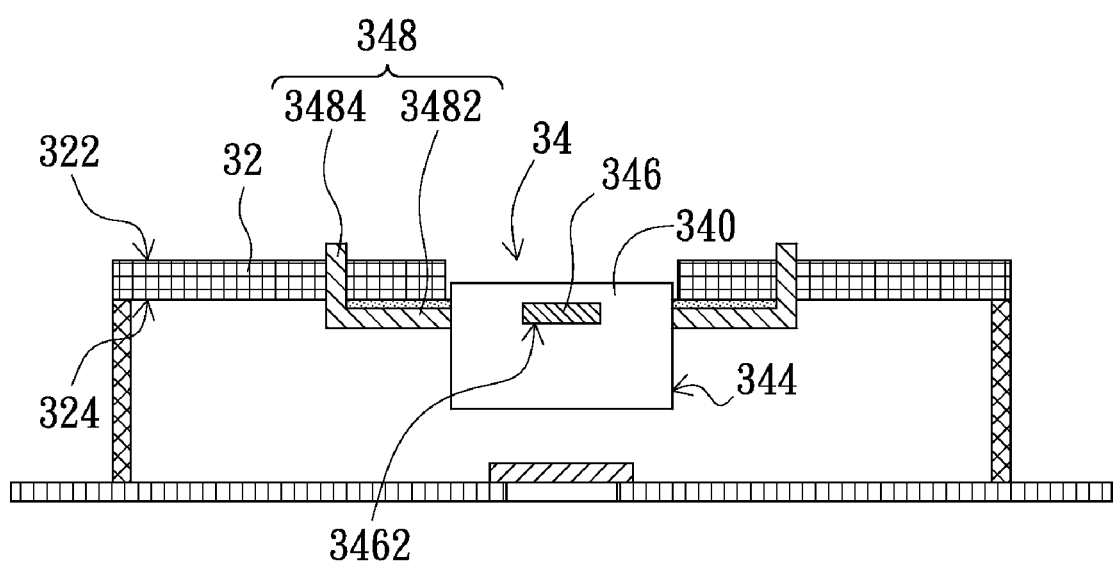
FIG. 3 is a schematic cross-section view illustrating n optical sensing module according the second embodiment of the invention.

FIG. 3 is a schematic cross-section view illustrating n optical sensing module according the second embodiment of the invention. Referring to FIG. 3, the optical sensing module 30 is similar to the optical sensing module 20, and the difference therebetween would be described thereinafter.

The lead frame 348 of the packaging body 34 has a shoulder portion 3482 and a connecting portion 3484. The shoulder portion 3482 extends out from the side surface 344 of the compound 340 along a direction parallel to the optical sensing surface 3462 of the optical sensing die 346 and is fixed on the lower surface 324 of the printed circuit board 32. The connecting portion 3484 extends from the outside end of the shoulder portion 3482 along the direction uprighted to the lower 324 and passes through the printed circuit board 32.

Figure 4:
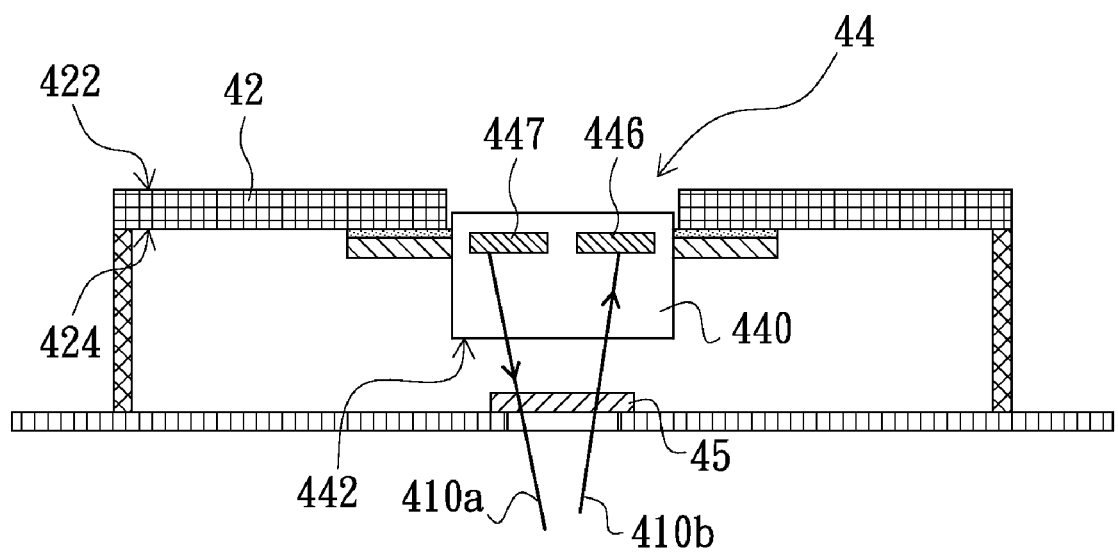
FIG. 4 is a schematic cross-section view illustrating n optical sensing module according the third embodiment of the invention.

FIG. 4 is a schematic cross-section view illustrating n optical sensing module according the third embodiment of the invention. Referring to FIG. 4, the optical sensing module 40 is similar to the optical sensing module 30, and the difference therebetween would be described thereinafter.

The packaging body 44 of the optical sensing module 40 further comprises light source 447 disposed in the compound 440. The height of the light source 447 related to the transparent surface 442 of the compound 440 is equal to the height of the optical sensing die 446 related to the transparent surface 442. For instance, when the light 410a emitted from the light source 447 illuminates the object, which, for example, is a mouse pad (not shown in FIG. 4), out of the optical sensing module 40 through the lens unit 45, a part of the light 410b reflected from the object to the optical sensing module 40 may be focused to the optical sensing die 446 by the lens unit 45. It should be noted that the lens unit 45 may be consisted of at least two lenses. One of the lenses is disposed at the path of the light 410a transmitting from the light source 447 to the external object and another one of the lenses is disposed at the path of the light 410b reflected from the external object to the optical sensing die 446, but the invention is not limited thereto.

Figure 5:
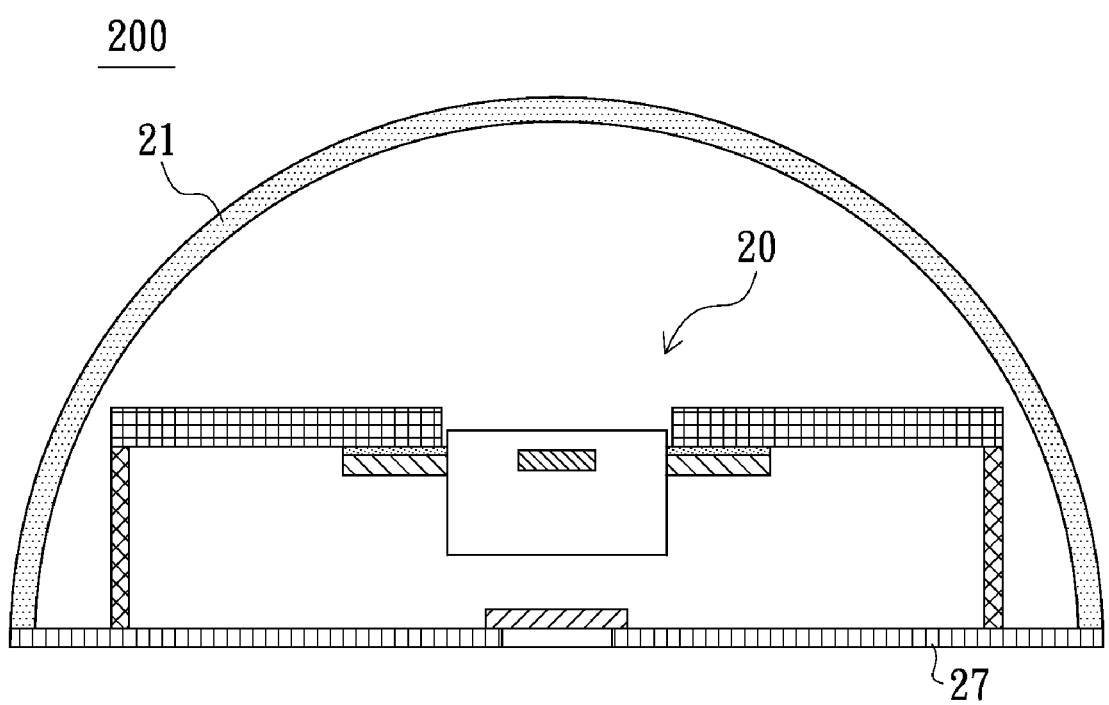
FIG. 5 is a schematic cross-section view illustrating an optical mouse according to an embodiment of the invention.

An embodiment is described for stating the application of the optical sensing module of the invention thereinafter, but the invention is not limited thereto. FIG. 5 is a schematic cross-section view illustrating an optical mouse according to an embodiment of the invention. Referring to FIG. 5, the optical mouse 200 comprises a shell 21 and an optical sensing module 20 disposed in the shell 21. The optical sensing module 20 is described in detail as the aforementioned, it is unnecessary to say herein. The bottom plate 27 of the optical sensing module 20 is connected to the shell 21. Specifically, the optical sensing module 20 may be replaced by the aforementioned optical sensing module 30 or the optical sensing module 40 in the optical mouse 200.

In summary, the packaging body of the optical sensing module and the optical mouse with the same of the invention is positioned on the lower surface of the printed circuit board and fixed to each other by the shoulder portion of the lead frame. Thus, during the assembling process of the optical sensing module, the assembling error resulted from the deformation of the compound and the thickness of the printed circuit board may be prevented. Therefore, the preciseness of assembling the optical sensing module may be improved and then the accuracy of the light focusing to the optical sensing die may be raised.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An optical sensing module, comprising:
   a printed circuit board having an upper surface and a lower surface opposite to each other; and
   a packaging body disposed on the lower surface of the printed circuit board, comprising:
      a compound having a transparent surface;
      an optical sensing die disposed inside and integrated with the compound, the optical sensing die having an optical sensing surface faced to the transparent surface of the compound for receiving a light; and
      a lead frame having a shoulder portion electrically connected to the optical sensing die, wherein the lead frame is partially covered by the compound and the shoulder portion extends out from the compound along a direction that is parallel to the optical sensing surface of the optical sensing die and is directly fixed on the lower surface.

2. The optical sensing module recited as claim 1, wherein the lower surface of the printed circuit board has a containing hole and the packaging body is embedded partially therein.

3. The optical sensing module recited as claim 2, wherein the containing hole passes through the upper surface and the lower surface.

4. The optical sensing module recited as claim 1, wherein the lead frame further has a connecting portion extends from the outside end of the shoulder portion along the direction uprighted to the lower surface and passes through the printed circuit board.

5. The optical sensing module recited as claim 1, wherein the packaging body further comprises a light source used for providing the light.

6. The optical sensing module recited as claim 5, wherein the light source is located in the compound, a height of the light source relative to the transparent surface is equal to that of the optical sensing die relative to the transparent surface.

7. The optical sensing module recited as claim 1, further comprising a lens unit disposed at the path of the light transmitted to the optical sensing die.

8. The optical sensing module recited as claim 7, further comprising a bottom plate disposed under the packaging body, the lens unit being disposed on the bottom plate.

9. The optical sensing module recited as claim 8, further comprising a printed circuit board rack disposed between the printed circuit board and the bottom plate.

10. An optical mouse, comprising:
a shell; and
an optical sensing module disposed in the shell, comprising:
a printed circuit board having an upper surface and a lower surface opposite to each other; and
a packaging body disposed on the lower surface of the printed circuit board, comprising:
a compound having a transparent surface;
an optical sensing die fixed in the compound and having an optical sensing surface faced to the transparent surface of the compound for receiving a light; and
a lead frame having a shoulder portion electrically connected to the optical sensing die, wherein the lead frame is partially covered by the compound and the shoulder portion extends out from the compound along a direction that is parallel to the optical sensing surface of the optical sensing die and is directly fixed on the lower surface.

11. The optical mouse recited as claim 10, wherein the lower surface of the printed circuit board has a containing hole and the packaging body is embedded partially therein.

12. The optical mouse recited as claim 11, wherein the containing hole passes through the upper surface and the lower surface.

13. The optical mouse recited as claim 10, wherein the lead frame further has a connecting portion extends from the outside end of the shoulder portion along the direction uprighted to the lower surface and passes through the printed circuit board.

14. The optical mouse recited as claim 10, wherein the packaging body further comprises a light source used for providing the light.

15. The optical mouse recited as claim 14, wherein the light source is located in the compound, a height of the light source relative to the transparent surface is equal to that of the optical sensing die relative to the transparent surface.

16. The optical mouse recited as claim 10, further comprising a lens unit disposed at the path of the light transmitted to the optical sensing die.

17. The optical mouse recited as claim 16, further comprising a bottom plate disposed under the packaging body, the lens unit being disposed on the bottom plate.

18. The optical mouse recited as claim 17, further comprising a printed circuit board rack disposed between the printed circuit board and the bottom plate.

* * * * *